(12) United States Patent
Zhao

(10) Patent No.: US 9,285,447 B2
(45) Date of Patent: Mar. 15, 2016

(54) IMAGING METHOD AND DEVICE FOR WATER/FAT SEPARATION IN MAGNETIC RESONANCE IMAGING

(71) Applicant: Cong Zhao, Shenzhen (CN)

(72) Inventor: Cong Zhao, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 436 days.

(21) Appl. No.: 13/770,144

(22) Filed: Feb. 19, 2013

(65) Prior Publication Data

US 2013/0214783 A1    Aug. 22, 2013

(30) Foreign Application Priority Data

Feb. 17, 2012 (CN) .......................... 2012 1 0035957

(51) Int. Cl.
*G01R 33/54* (2006.01)
*G01R 33/48* (2006.01)
*G01R 33/561* (2006.01)
*G01R 33/565* (2006.01)

(52) U.S. Cl.
CPC ............ *G01R 33/54* (2013.01); *G01R 33/4828* (2013.01); *G01R 33/5617* (2013.01); *G01R 33/56518* (2013.01)

(58) Field of Classification Search
CPC ............... G01R 33/4828; G01R 33/54; G01R 33/5617; G01R 33/56518; G01R 33/56563; G01R 33/5607; G01R 33/5608; A61B 5/055
USPC .................. 324/307, 309, 318; 600/410, 419; 382/131
See application file for complete search history.

(56) References Cited

U.S. PATENT DOCUMENTS

| | | | | |
|---|---|---|---|---|
| 5,602,476 | A * | 2/1997 | Liu et al. ..................... | 324/309 |
| 6,263,228 | B1 * | 7/2001 | Zhang et al. ................. | 600/409 |
| 2004/0064032 | A1 * | 4/2004 | Ma ............................... | 600/410 |
| 2006/0250132 | A1 * | 11/2006 | Reeder et al. ................ | 324/307 |
| 2010/0259260 | A1 * | 10/2010 | Lee et al. ...................... | 324/309 |

* cited by examiner

*Primary Examiner* — Melissa Koval
*Assistant Examiner* — Rishi Patel
(74) *Attorney, Agent, or Firm* — Schiff Hardin LLP

(57) ABSTRACT

In an imaging method and device for water/fat separation in MRI using a two-point Dixon FSE sequence, each refocusing RF pulse corresponds to two readout gradients of the same polarity, each being center-divided into a smaller rear part and a larger front part, and one rephasing gradient of opposite polarity. In running the FSE sequence, each echo signal acquired is subjected to an FFT, to reconstruct an image with water and fat in phase and an image with water and fat in opposed phases. Data of each echo signal are subjected to a partial Fourier transform; and the in-phase water/fat image and the opposite-phase water/fat image are subjected to a water/fat separation algorithm, to obtain a pure water image and a pure fat image.

11 Claims, 6 Drawing Sheets

IMAGING METHOD AND DEVICE FOR WATER/FAT SEPARATION IN MAGNETIC RESONANCE IMAGING

BACKGROUND OF THE INVENTION

1. Field of the Invention

The present invention relates to the technical field of magnetic resonance imaging (MRI), in particular to an imaging method and device for water/fat separation in magnetic resonance imaging, and also relates to a machine-readable storage medium and a computer program.

2. Description of the Prior Art

In magnetic resonance imaging (MRI), hydrogen protons in fat tissue in the human body and hydrogen protons in other tissues have different molecular environments, and as a result have different resonant frequencies. When hydrogen protons in fat and other tissue are simultaneously excited by an RF pulse, the relaxation times thereof are also different. Signals are acquired at different echo times, and fat tissue and non-fat tissue display different phases and signal strengths.

The Dixon method is a method for generating a pure water proton image in MRI. The basic principle thereof is to separately acquire two types of echo signals, in-phase and opposed-phase, for water and fat protons; the two types of signals with different phases undergo arithmetic operation, each producing a pure water proton image and a pure fat proton image, thereby achieving the objective of fat suppression. There are currently many Dixon imaging methods for water/fat separation in the art, including: the single-point Dixon method, the two-point Dixon method and the three-point Dixon method, etc. In a turbo spin echo (TSE; also called a fast spin echo, FSE) pulse sequence based on the Dixon method, the radio frequency (RF) pulse sequence comprises a 90° excitation pulse and 180° refocusing pulses (also called rephasing pulses); multiple echoes can be acquired between two adjacent refocusing pulses (i.e. in one echo interval). Different echoes corresponding to the same refocusing pulse use the same phase encoding, and the echoes corresponding to corresponding positions of different refocusing pulses form an echo set; for example: the first echo appearing after refocusing pulse 1, the first echo appearing after refocusing pulse 2, . . . , the first echo appearing after refocusing pulse n could form one echo set, while the second echo appearing after refocusing pulse 1, the second echo appearing after refocusing pulse 2, . . . , the second echo appearing after refocusing pulse n could form another echo set. One image can be reconstructed from each echo set independently. Since different echoes carry different amplitude and phase information, further calculation allows a pure water image and a pure fat image to be reconstructed separately.

FIG. 1 shows an FSE sequence based on the two-point Dixon method. Single-pole symmetric readout gradients are used, i.e. the readout gradients have the same polarity, and have a symmetric shape with the center of an echo as the axis of symmetry. The echo signals acquired are as shown in formula (1) below:

$$S_\tau = W + F \exp(j f_\Delta \tau) \quad (1)$$

Here, $S_\tau$ is the signal obtained for the echo offset $\tau$, W is the water signal from the object under test, F is the fat signal from the object under test, the difference between the resonant frequencies of fat and water is represented by $f_\Delta$ with units of Hertz (Hz), and j is the square root of $-1$.

In FIG. 1, $\tau=0$ at the center of each echo interval, and the spin echo sequence requirement is met; a conventional spin echo image can be obtained by means of echo 12 and echo 22, the signals acquired for echo 12 and echo 22 being expressed as formula (2) below:

$$S_0 = W + F \quad (2)$$

With regard to echo 11 and echo 21, the echo centers thereof are offset with respect to the center of the echo interval, and when $\tau$ is delta$=-\frac{1}{2}f_\Delta$ and F and W have a phase difference of 180°, the signals acquired for echo 11 and echo 21 are expressed as formula (3) below:

$$S_{delta} = W - F \quad (3)$$

Clearly, by processing the echo signals in accordance with formulas (2) and (3), it is possible to work out the water signal W and the fat signal F. Two sets of echoes can be obtained using the FSE sequence based on the two-point Dixon method shown in FIG. 1. Suppose that there are n refocusing pulses; then one set comprises echo 11, echo 21, echo n1, while the other set comprises echo 12, echo 22, . . . , echo n2. By processing the signals from these two sets of echoes separately, two images can be reconstructed: one is an image in conformity with formula (2), with water and fat in phase, while the other is an image in conformity with formula (3), with water and fat in opposed phases. By subjecting these two images to a water/fat separation algorithm, a pure water image and a pure fat image can be obtained separately.

In the FSE sequence shown in FIG. 1, a reverse rephasing gradient must be inserted between two single-pole readout gradients in each echo interval, such as rephasing gradient 1 and rephasing gradient 2 in FIG. 1. Each readout gradient is divided by the center of the echo into two symmetric parts, which may be referred to as the front part and rear part of the readout gradient, and the moment of the rephasing gradient must be equal to the sum of the moments of the rear part of the preceding readout gradient and the front part of the subsequent readout gradient. In a drawing of an FSE sequence, the moment of a gradient can be characterized by the area of the gradient (the area being related to the gradient duration, rate of change of the gradient, and the amplitude, etc.). In other words, the area of the rephasing gradient is equal to the sum of the areas of the rear part of the preceding readout gradient and the front part of the subsequent readout gradient. Therefore the amplitude of the rephasing gradient will be higher than that of the readout gradients. However, in a low-field scanner (also called a low-field magnetic resonance system), gradients of high amplitude will generally cause serious problems in the form of eddy currents and accompanying fields, leading to a serious problem of artifacts (such as fuzziness, ghosts and shadows) in the reconstructed image. In particular, this problem with artifacts caused by eddy currents and accompanying fields will be more pronounced when an FSE sequence with a longer echo chain is used (i.e. a greater number of echoes appear during one excitation pulse cycle (TR)).

FIG. 2 shows an example of an image obtained by a low-field scanner using the FSE sequence shown in FIG. 1 and T2-weighted imaging. In FIG. 2, the left half shows extreme fuzziness of a water/fat separated image in a neck imaging application, while the right half shows a shadow which has appeared as a result of extreme non-uniformity of signal strength in phantom imaging.

It can be seen from the above that imaging technology for water/fat separation based on the two-point Dixon method in the prior art does not give ideal imaging results. The problem of eddy currents and accompanying fields caused by rephasing gradients of high amplitude is in urgent need of a solution, in order to mitigate the problem of artifacts in MRI.

SUMMARY OF THE INVENTION

An object of the present invention is to provide an imaging method and device for water/fat separation in magnetic resonance imaging, which are capable of mitigating the problem of artifacts in water/fat separation imaging.

The imaging method for water/fat separation in magnetic resonance imaging provided in the embodiments of the present invention employs an FSE sequence based on the two-point Dixon method, wherein each refocusing RF pulse corresponds to two readout gradients of the same polarity and one rephasing gradient of opposite polarity, and each readout gradient is divided into a front part and a rear part by the center of an echo; of the two readout gradients corresponding to each refocusing RF pulse, the rear part of a front readout gradient is smaller in area than the front part thereof, and the front part of a rear readout gradient is smaller in area than the rear part thereof; the method comprises: running the FSE sequence; subjecting each echo signal acquired to a fast Fourier transform (FFT), so as to reconstruct an image with water and fat in phase and an image with water and fat in opposed phases, wherein data of each echo signal is further subjected to a partial Fourier transform; and subjecting the image with water and fat in phase and the image with water and fat in opposed phases to a water/fat separation algorithm, to obtain a pure water image and a pure fat image.

In one embodiment of the present invention, of the two readout gradients corresponding to each refocusing RF pulse, the duration of the rear part of the front readout gradient is less than or equal to the duration of the front part thereof, and the duration of the front part of the rear readout gradient is less than or equal to the duration of the rear part thereof.

In one embodiment of the present invention, of the two readout gradients and the rephasing gradient corresponding to each refocusing RF pulse, when the front readout gradient switches to the rephasing gradient, the front readout gradient rises from a first amplitude to a zero gradient value at a maximum rate of gradient change, and when the rephasing gradient switches to the rear readout gradient, the rear readout gradient falls from the zero gradient value to the first amplitude at the maximum rate of gradient change; the rephasing gradient rises from the zero gradient value to a second amplitude at the maximum rate of gradient change, and falls from the second amplitude to the zero gradient value at the maximum rate of gradient change; or the rephasing gradient rises from the zero gradient value to a second amplitude at a rate of gradient change that is less than the maximum rate of gradient change, and falls from the second amplitude to the zero gradient value at the rate of gradient change that is less than the maximum rate of gradient change; or the rephasing gradient rises from the zero gradient value to a second amplitude along a first curve, and falls from the second amplitude to the zero gradient value along a second curve, wherein the first curve and the second curve are axisymmetric curves with the center of the rephasing gradient as an axis.

In one embodiment of the present invention, of the two readout gradients and the rephasing gradient corresponding to each refocusing RF pulse, when the front readout gradient switches to the rephasing gradient, the front readout gradient rises from a first amplitude to a zero gradient value at a first rate of gradient change that is less than a maximum rate of gradient change, and when the rephasing gradient switches to the rear readout gradient, the rear readout gradient falls from the zero gradient value to the first amplitude at the first rate of gradient change; the rephasing gradient rises from the zero gradient value to a second amplitude at the maximum rate of gradient change, and falls from the second amplitude to the zero gradient value at the maximum rate of gradient change; or the rephasing gradient rises from the zero gradient value to a second amplitude at a second rate of gradient change that is less than the maximum rate of gradient change, and falls from the second amplitude to the zero gradient value at the second rate of gradient change; or the rephasing gradient rises from the zero gradient value to a second amplitude along a first curve, and falls from the second amplitude to the zero gradient value along a second curve, wherein the first curve and the second curve are axisymmetric curves with the center of the rephasing gradient as an axis.

Optionally, the second rate of gradient change is equal to the first rate of gradient change.

In one embodiment of the present invention, of the two readout gradients and the rephasing gradient corresponding to each refocusing RF pulse, when the front readout gradient switches to the rephasing gradient, the front readout gradient rises from a first amplitude to a zero gradient value along a first curve, and when the rephasing gradient switches to the rear readout gradient, the rear readout gradient falls from the zero gradient value to the first amplitude along a second curve, wherein the first curve and the second curve are axisymmetric curves with the center of the rephasing gradient as an axis; the rephasing gradient rises from the zero gradient value to a second amplitude at a maximum rate of gradient change, and falls from the second amplitude to the zero gradient value at the maximum rate of gradient change; or the rephasing gradient rises from the zero gradient value to a second amplitude at a rate of gradient change that is less than the maximum rate of gradient change, and falls from the second amplitude to the zero gradient value at the rate of gradient change that is less than the maximum rate of gradient change; or the rephasing gradient rises from the zero gradient value to a second amplitude along a third curve, and falls from the second amplitude to the zero gradient value along a fourth curve, wherein the third curve and the fourth curve are axisymmetric curves with the center of the rephasing gradient as an axis.

Optionally, the third curve and the first curve are a centrosymmetric curve with its center at the point of the zero gradient value to which the front readout gradient rises, and the fourth curve and the second curve are a centrosymmetric curve with its center at the point of the zero gradient value at which the rear readout gradient begins.

Optionally, the absolute values of the first amplitude and the second amplitude are the same.

Optionally, the sampling window for each echo signal includes a platform period of the readout gradient corresponding to the echo signal; or the sampling window for each echo signal includes a platform period of the readout gradient corresponding to the echo signal and part or all of an edge period of the readout gradient.

Optionally, the step of subjecting each echo signal acquired to an FFT so as to reconstruct an image with water and fat in phase and an image with water and fat in opposed phases comprises: converting an analog signal of each echo signal acquired to a digital signal; completing phase encoding and FFT of the digital signal of each echo signal, so as to form complex image data for each echo signal and fill k-space with the same, wherein a readout line sampled from each echo signal is subjected to a partial Fourier transform before being subjected to an FFT in the readout encoding direction of k-space; and the complex image data of each echo signal comprises image data with water and fat in phase and image data with water and fat in opposing phases.

The embodiments of the present invention also provide an imaging device for water/fat separation in magnetic resonance imaging corresponding to the above method, the device employing any one of the above FSE sequences and comprising: a signal sequence providing module, for running the FSE sequence; an image reconstruction module, for subjecting each echo signal acquired to a Fast Fourier Transform (FFT) so as to reconstruct an image with water and fat in phase and an image with water and fat in opposed phases, wherein data of each echo signal is further subjected to a partial Fourier transform; and a water/fat separation module, for subjecting the image with water and fat in phase and the image with water and fat in opposed phases, obtained by the image reconstruction module, to a water/fat separation algorithm, to obtain a pure water image and a pure fat image.

The embodiments of the present invention also provide a machine-readable storage medium, which stores commands for making a machine perform any of the above methods.

The embodiments of the present invention also provide a computer program, for making a machine perform any of the above methods when run in the machine.

It can be seen from the above solution that by using an improved FSE sequence, it is possible to lower the momentum requirement of the rephasing gradient and reduce the amplitude thereof, thereby reducing the effect of eddy currents and mitigating the problem of artifacts in water/fat separation imaging.

DESCRIPTION OF THE PREFERRED EMBODIMENTS

The present invention is described in further detail below by way of examples, in order to explain the object, technical solution and advantages thereof.

Figure 1:
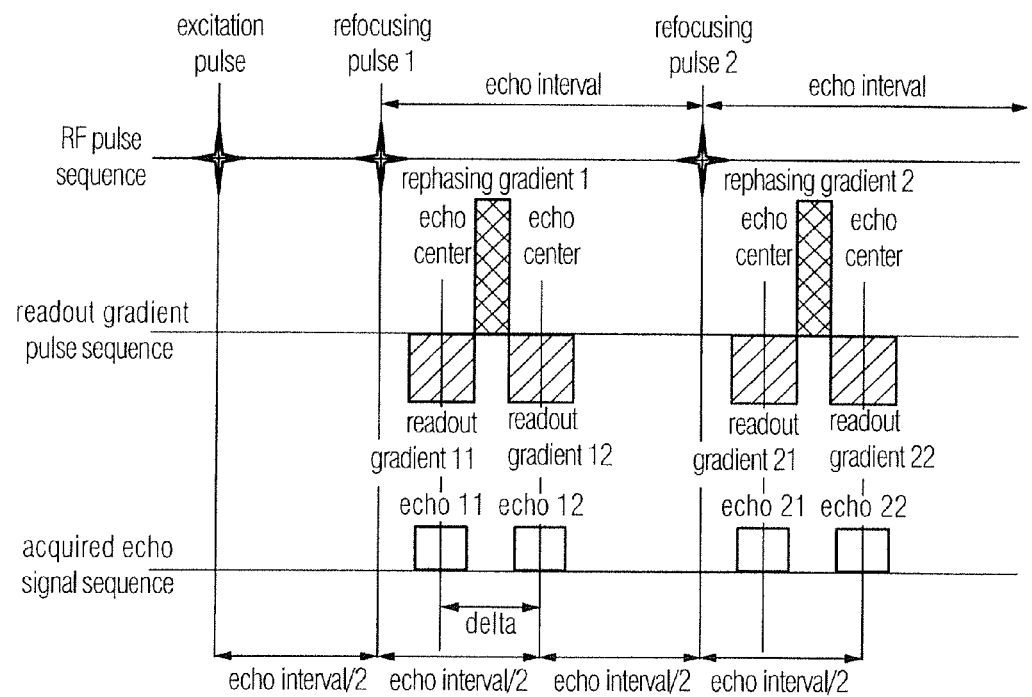
FIG. 1 is a schematic diagram of an FSE sequence based on the two-point Dixon method according to the prior art.
Figure 2:
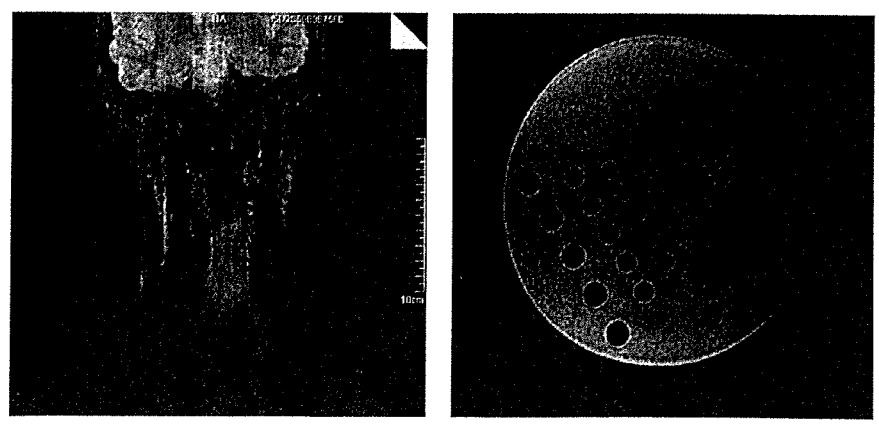
FIG. 2 shows an example of an image obtained by a low-field scanner using the FSE sequence shown in FIG. 1 and T2-weighted imaging.
Figure 3:
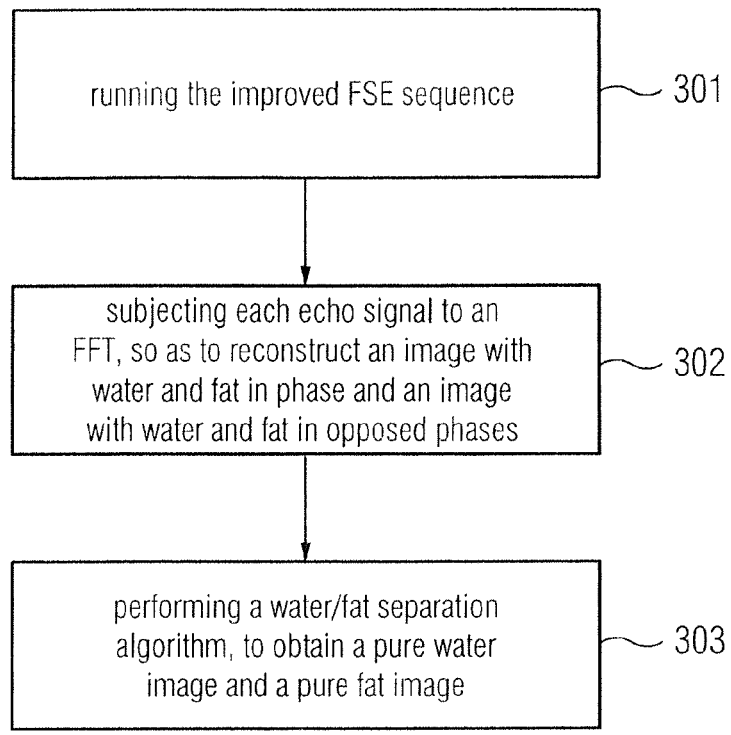
FIG. 3 is a flowchart of the imaging method for water/fat separation imaging according to the embodiments of the present invention.

The embodiments of the present invention provide an imaging method for fat/water separation in MRI, the method employing an FSE sequence based on the two-point Dixon method. The embodiments of the present invention provide an improved FSE sequence, wherein each refocusing RF pulse corresponds to two readout gradients of the same polarity and one rephasing gradient of opposite polarity; each of the two readout gradients corresponding to each refocusing RF pulse is divided into a front part and a rear part by the center of an echo, the rear part of a front readout gradient being smaller in area than the front part thereof, and the front part of a rear readout gradient being smaller in area than the rear part thereof. As FIG. 3 shows, the method comprises the following steps:

Step 301: Running the improved FSE sequence.

Step 302: Subjecting each echo signal acquired to a fast Fourier transform (FFT), so as to reconstruct an image with water and fat in phase and an image with water and fat in opposed phases, wherein data of each echo signal is further subjected to a partial Fourier transform. Here, the partial Fourier transform may be the Margosian algorithm or the Projections Onto Convex Sets (POCS) algorithm.

Step 303: Subjecting the image with water and fat in phase and the image with water and fat in opposed phases, obtained in step 302, to a ater/fat separation algorithm, to obtain a pure water image and a pure fat image.

In one embodiment of the present invention, of the two readout gradients corresponding to each refocusing RF pulse, the duration of the rear part of the front readout gradient is less than or equal to the duration of the front part thereof, and the duration of the front part of the rear readout gradient is less than or equal to the duration of the rear part thereof. In particular, several ways of implementing the two readout gradients corresponding to each refocusing RF pulse are given below:

1. When the front readout gradient switches to the rephasing gradient, the front readout gradient rises at a maximum rate of gradient change, and when the rephasing gradient switches to the rear readout gradient, the rear readout gradient falls at the maximum rate of gradient change.

2. When the front readout gradient switches to the rephasing gradient, the front readout gradient rises at a rate of gradient change that is less than the maximum rate of gradient change, and when the rephasing gradient switches to the rear readout gradient, the rear readout gradient falls at the rate of gradient change that is less than the maximum rate of gradient change.

In examples 1 and 2 above, the front readout gradient and the rear readout gradient both change linearly when rising and falling, respectively, but according to the embodiments of the present invention, the readout gradients may also change in a non-linear manner, as described in 3 below.

3. When the front readout gradient switches to the rephasing gradient, the front readout gradient rises along a curve, and when the rephasing gradient switches to the rear readout gradient, the rear readout gradient falls along an axisymmetric curve with the center of the rephasing gradient as the axis. Here, the curves may be designed to be circular or oval curves as required, and may also be parabolic curves, etc. In this case, the gradient changing along a curve can reduce the effect of eddy currents.

In examples 1-3 above, the rephasing gradient may rise and fall at a maximum rate of gradient change, or rise and fall at some rate of gradient change less than the maximum rate of gradient change, or rise and fall along a curve.

In one embodiment of the present invention, if the front readout gradient changes linearly when rising, the rephasing gradient rises at the same rate of gradient change; if the rear readout gradient changes linearly when falling, the rephasing gradient falls at the same rate of gradient change. In this way, the effect of eddy currents can be further reduced.

In one embodiment of the present invention, if the front readout gradient rises along a curve, the rephasing gradient rises along a centrosymmetric curve with its center at the point of the zero gradient value to which the front readout gradient rises; if the rear readout gradient changes linearly when falling, the rephasing gradient falls along a centrosymmetric curve with its center at the point of the zero gradient value at which the rear readout gradient begins. In this way, the effect of eddy currents can be further reduced.

In one embodiment of the present invention, the values of the durations of the rear part of the front readout gradient and the front part of the rear readout gradient, and the rates of gradient change, can be set so that the rear part of the front readout gradient and the front part of the rear readout gradient are trapezoidal or triangular in shape; the rephasing gradient can also be made to have the same amplitude and rate of gradient change as the front readout gradient and rear readout gradient, in which case the gradient waveform in the readout direction is perfectly symmetrical, which can reduce the effect of accompanying fields.

In one embodiment of the present invention, the values of the durations of the rear part of the front readout gradient and the front part of the rear readout gradient, and the curves followed when the gradients are changing, can be set so that the rephasing gradient, front readout gradient and rear readout gradient have the same amplitude and symmetric change curves, in which case the gradient waveform in the readout direction is perfectly symmetrical, which can reduce the effect of accompanying fields.

FIGS. 4A-4D show an example of a readout gradient in an FSE sequence according to the prior art, and several examples of readout gradients in the improved FSE sequence according to embodiments of the present invention.

Figure 4A:
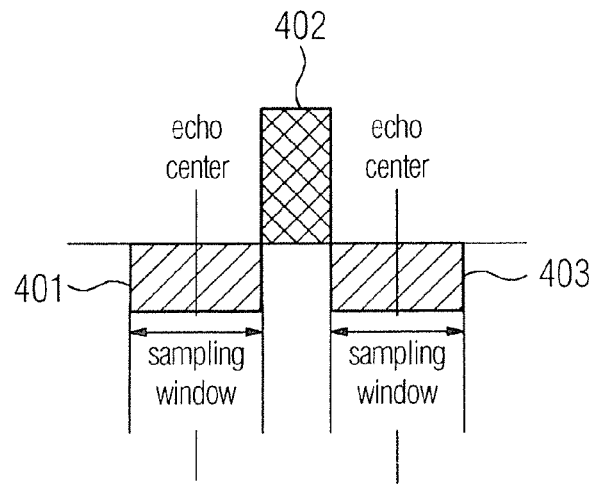
FIGS. 4A-4D show an example of a readout gradient in an FSE sequence according to the prior art, and several examples of readout gradients in the improved FSE sequence according to embodiments of the present invention.

FIG. 4A shows an example of a readout gradient in an FSE sequence according to the prior art. In this example, readout gradient 401 and readout gradient 403 are symmetric in shape with respect to the centers of the echoes as axes. When the readout gradient 401 switches to the rephasing gradient 402, the gradient rises at the maximum rate of gradient change. When the rephasing gradient 402 switches to the readout gradient 403, the gradient falls at the maximum rate of gradient change too. Thus from a microscopic perspective, readout gradient 401, rephasing gradient 402 and readout gradient 403 are actually trapezoidal, but from a macroscopic perspective, readout gradient 401, rephasing gradient 402 and readout gradient 403 are approximately rectangular. The rectangular gradients (including readout gradients and rephasing gradients) shown in the figures accompanying this text all represent gradients which rise and fall at the maximum rate of gradient change. As can be seen from FIG. 4A, because the duration left for the rephasing gradient 402 is relatively short, the amplitude of the rephasing gradient 402 is relatively large, as a result of which the quite serious problem of artifacts mentioned in the Background Art section will arise.

Figure 4B:
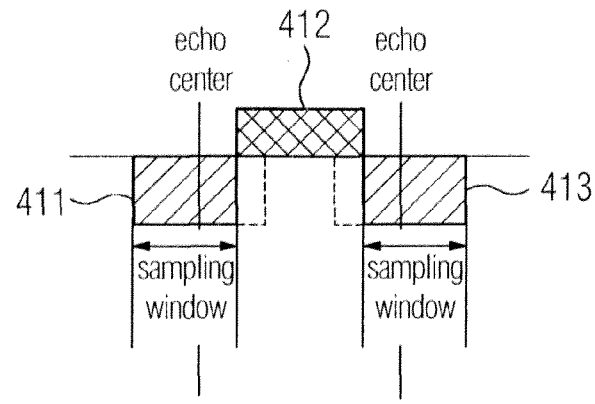

FIG. 4B shows an example of a readout gradient in an improved FSE sequence according to an embodiment of the present invention. In this embodiment, readout gradient 411 and readout gradient 413 are asymmetric in shape with respect to the centers of the echoes as axes. When readout gradient 411 switches to rephasing gradient 412, the gradient rises at the maximum rate of gradient change; when the rephasing gradient 412 switches to readout gradient 413, the gradient falls at the maximum rate of gradient change too. To facilitate comparison of the differences between this example and the example shown in FIG. 4A, the dotted lines in FIG. 4B mark the edges of readout gradient 401 and readout gradient 403 shown in FIG. 4A. It can be seen from FIG. 4B that the duration of the rear part of gradient 411 is less than the duration of the front part thereof, while the duration of the front part of gradient 413 is less than the duration of the rear part thereof; in other words, the moment of rephasing gradient 412 is less than that of rephasing gradient 402 in FIG. 4A, i.e. the area of rephasing gradient 412 is less than that of rephasing gradient 402. Moreover, since the durations of readout gradient 411 and readout gradient 413 are reduced, the duration of rephasing gradient 412 is greater than that of rephasing gradient 402. Clearly, the amplitude of rephasing gradient 412 is notably smaller than that of rephasing gradient 402, and may even be smaller than the amplitudes of readout gradient 411 and readout gradient 413. In this way the accompanying field can be significantly weakened, leading to significant mitigation of the problem of artifacts in MRI.

Figure 4C:
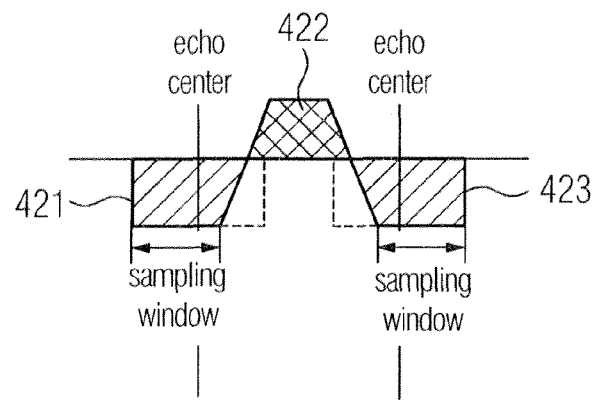

FIG. 4C shows an example of a readout gradient in an improved FSE sequence according to an embodiment of the present invention. In this embodiment, readout gradient 421 and readout gradient 423 are asymmetric in shape with respect to the centers of the echoes as axes. When readout gradient 421 switches to rephasing gradient 422, the gradient rises at some rate of gradient change that is less than the maximum rate of gradient change; when rephasing gradient 422 switches to readout gradient 423, the gradient falls at this rate of gradient change too. The dotted lines in FIG. 4C mark the edges of readout gradient 401 and readout gradient 403 in FIG. 4A. As can be seen from FIG. 4C, the duration of the rear part of readout gradient 421 is less than the duration of the front part thereof, while the duration of the front part of readout gradient 423 is less than the duration of the rear part thereof; in other words, the momentum of rephasing gradient 422 is less than that of rephasing gradient 402 in FIG. 4A, i.e. the area of rephasing gradient 422 is less than that of rephasing gradient 402. Moreover, since the durations of readout gradient 421 and readout gradient 423 are reduced, the duration of rephasing gradient 422 is greater than that of rephasing gradient 402. Clearly, the amplitude of rephasing gradient 422 is notably smaller than that of rephasing gradient 402, and may even be smaller than or equal to the amplitudes of readout gradient 421 and readout gradient 423, so that the accompanying field is significantly weakened. In addition, the use of a smaller rate of gradient change can further reduce the generation of eddy currents. Thus the problem of artifacts in MRI can be mitigated to a greater extent by using this readout gradient example.

Figure 4D:
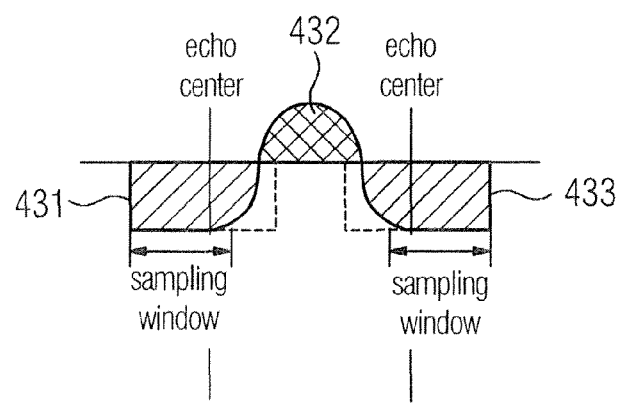

FIG. 4D shows an example of a readout gradient in an improved FSE sequence according to an embodiment of the present invention. In this embodiment, readout gradient 431 and readout gradient 433 are asymmetric in shape with respect to the centers of the echoes as axes. When readout gradient 431 switches to rephasing gradient 432, the gradient of readout gradient 431 rises along a circular curve, and rephasing gradient 432 rises along a centrosymmetric circular curve with its center at the point of the zero gradient value to which readout gradient 431 rises. When rephasing gradient 432 switches to readout gradient 433, readout gradient 433 falls along a circular curve, and rephasing gradient 432 falls along a centrosymmetric circular curve with its center at the point of the zero gradient value at which readout gradient 433 begins. Here, the circular curve along which readout gradient 433 falls and the circular curve along which readout gradient 431 rises are of an axisymmetric shape with the center of rephasing gradient 432 as an axis. The dotted lines in FIG. 4D mark the edges of readout gradient 401 and readout gradient 403 shown in FIG. 4A. As can be seen from FIG. 4D, the duration of the rear part of readout gradient 431 is less than that of the front part thereof, while the duration of the front part of readout gradient 433 is less than that of the rear part thereof; in other words, the moment of rephasing gradient 432 is less than that of rephasing gradient 402 in FIG. 4A, i.e. the area of rephasing gradient 432 is less than that of rephasing gradient 402. Moreover, since the durations of readout gradient 431 and readout gradient 433 are reduced, the duration of rephasing gradient 432 is greater than that of rephasing gradient 402. Clearly, the amplitude of rephasing gradient 432 is notably smaller than that of rephasing gradient 402, and may even be smaller than or equal to the amplitudes of readout gradient 431 and readout gradient 433, so that the accompanying field is significantly weakened. In addition, the fact that the gradients change along circular curves leads to a further reduction in the generation of eddy currents. Thus the problem of artifacts in MRI can be mitigated to a greater extent by using this readout gradient example.

In the embodiments of the present invention, the sampling window for the echo signal can be set as the platform period of the readout gradient, or be extended to the edge period. Here, the so-called platform period is the period of time during which the readout gradient is held at the amplitude, while the so-called edge period is the period of time during which the gradient value of the readout gradient rises from the amplitude or falls to the amplitude. In other words, the sampling window for the echo signal may comprise the platform period of the readout gradient, or comprise the platform period of the echo signal and part or all of the edge period thereof. Sampling points in the platform period of the readout gradient are uniformly distributed in k-space, while sampling points in the edge period of the readout gradient are non-uniformly distributed in k-space; therefore in the case where the sampling window for the echo signal is extended to the edge period of the readout gradient, the edge period sampling points can be converted to uniformly distributed k-space sampling points by means of a re-sampling algorithm, so as to form a half-Fourier k-space together with the platform period sampling points.

It can be seen from FIGS. 4B-4D that the sampling windows of the readout gradients are set as the platform periods in FIGS. 4B and 4C, whereas in FIG. 4D the sampling windows of the readout gradients comprise not only the platform periods of the readout gradients but also part of the edge periods of the readout gradients.

Using any of the above readout gradients and rephasing gradient examples, each echo signal acquired can be subjected to a Fast Fourier Transform (FFT) so as to complete image reconstruction.

Specifically, each echo signal acquired is first converted to a digital signal, phase encoding and FFT are completed before forming complex image data of each echo signal and filling k-space with the same, and the k-space data can then be used to reconstruct a water/fat separated image. Here, three-dimensional k-space includes three encoding directions: readout, phase and partition. Before subjecting the readout line sampled from each echo signal to an FFT in the readout encoding direction, the readout line is subjected to a partial Fourier transform in the readout encoding direction.

Figure 5:
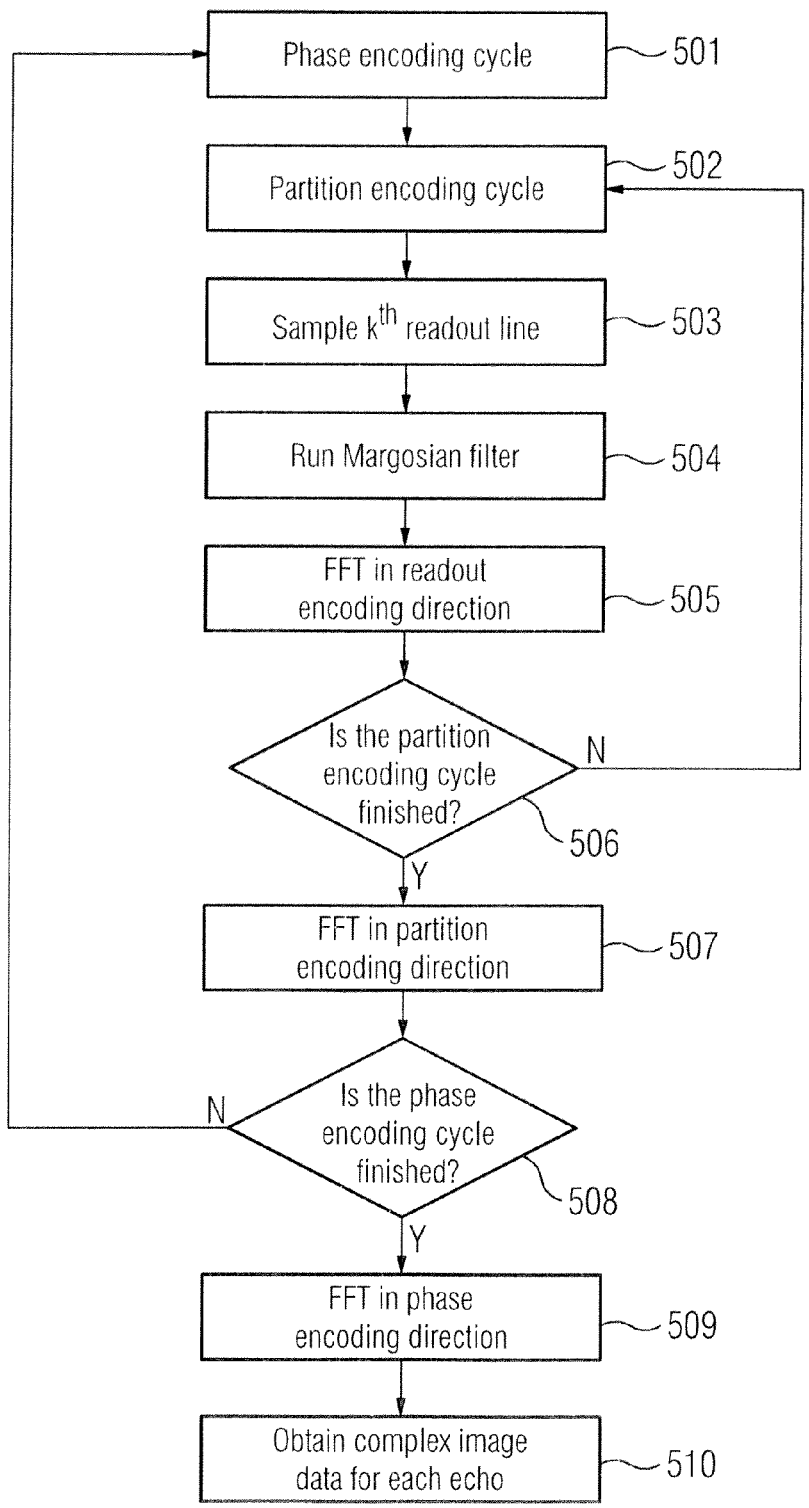
FIG. 5 is a flowchart of an image reconstruction method according to the embodiments of the present invention.

FIG. 5 shows a flow chart of an image reconstruction method according to the embodiments of the present invention. As FIG. 5 shows, it comprises the following steps:

Step 501: entering the phase encoding cycle.
Step 502: entering the partition encoding cycle.
Step 503: sampling the $k^{th}$ readout line. One readout line is the data of one echo signal; k is an integer with an initial value of 1, and is incremented by 1 each time step 503 is performed, so that the data of each echo signal can be sampled in sequence.
Step 504: running a Margosian filter, so as to subject the readout line sampled in step 503 to a partial Fourier transform.
Step 505: subjecting the readout line processed in step 504 to an FFT in the readout encoding direction.
Step 506: judging whether the partition encoding cycle is finished; if it is not, returning to step 502, otherwise performing step 507.
Step 507: performing an FFT in the partition encoding direction.
Step 508: judging whether the phase encoding cycle is finished; if it is not, returning to step 501, otherwise performing step 509.
Step 509: performing an FFT in the phase encoding direction.
Step 510: obtaining complex image data for each echo and filling k-space with the same. The complex image data of each echo signal comprises image data with water and fat in phase and image data with water and fat in opposing phases.

A pure water image and a pure fat image can be obtained by performing a water/fat separation algorithm, using the complex image data of each echo signal. Specifically, the following steps are performed on the complex image data of each echo signal:

1. Removing common phases from $S_{delta}$ of the image with water and fat in opposed phases, and $S_0$ of the image with water and fat in phase.
2. Calculating the complex square of $S_{delta}$, written as $S^2_{delta}$.
3. Extracting the phase from $S^2_{delta}$, performing phase unwrapping, and writing the unwrapped phase as $\Phi$.
4. Calculating pure water image data using the formula $$\frac{1}{2}[S_0 + S_{delta}\exp(-j\Phi/2)],$$

and calculating pure fat image data using the formula $$\frac{1}{2}[S_0 - S_{delta}\exp(-j\Phi/2)].$$

Figure 6:
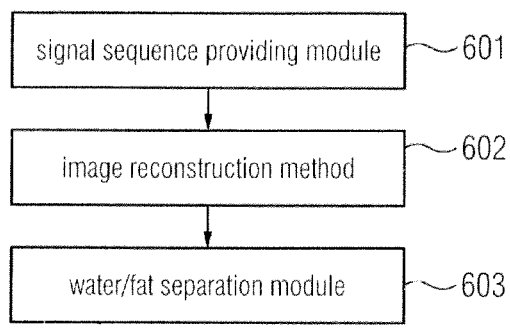
FIG. 6 is a schematic diagram of the assembly structure of the imaging device for water/fat separation according to the embodiments of the present invention.

FIG. 6 is a schematic diagram of the assembly structure of the imaging device for water/fat separation according to the embodiments of the present invention. As FIG. 6 shows, the device comprises: a signal sequence providing module 601, an image reconstruction module 602 and a water/fat separation module 603. The signal sequence providing module 601 runs the improved FSE sequence provided in the embodiments of the present invention; the image reconstruction module 602 subjects each echo signal acquired to an FFT, so as to reconstruct an image with water and fat in phase and an image with water and fat in opposed phases, wherein the data of each signal is subjected to a partial Fourier transform; the water/fat separation module 603 subjects the image with water and fat in phase and the image with water and fat in opposed phases, obtained by the image reconstruction module 602, to a water/fat separation algorithm, to obtain a pure water image and a pure fat image.

The principles by which the above modules are specifically realized have already been described in the foregoing text and will not be repeated here.

Figure 7:
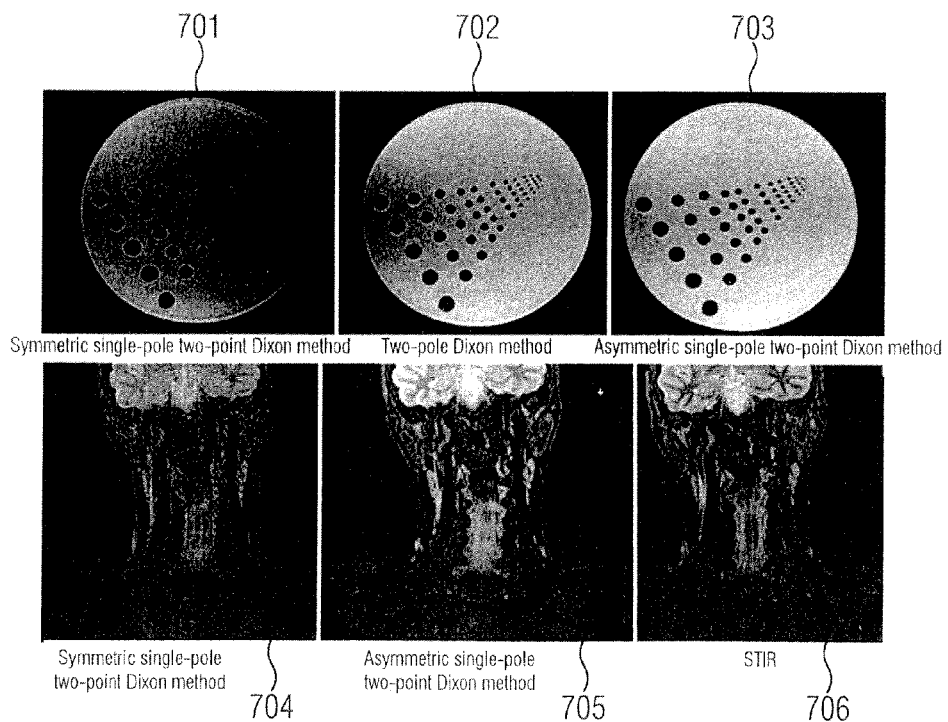
FIG. 7 shows examples of water/fat separated images obtained using embodiments of the present invention, and examples of images obtained in accordance with the prior art.
Figure 8:
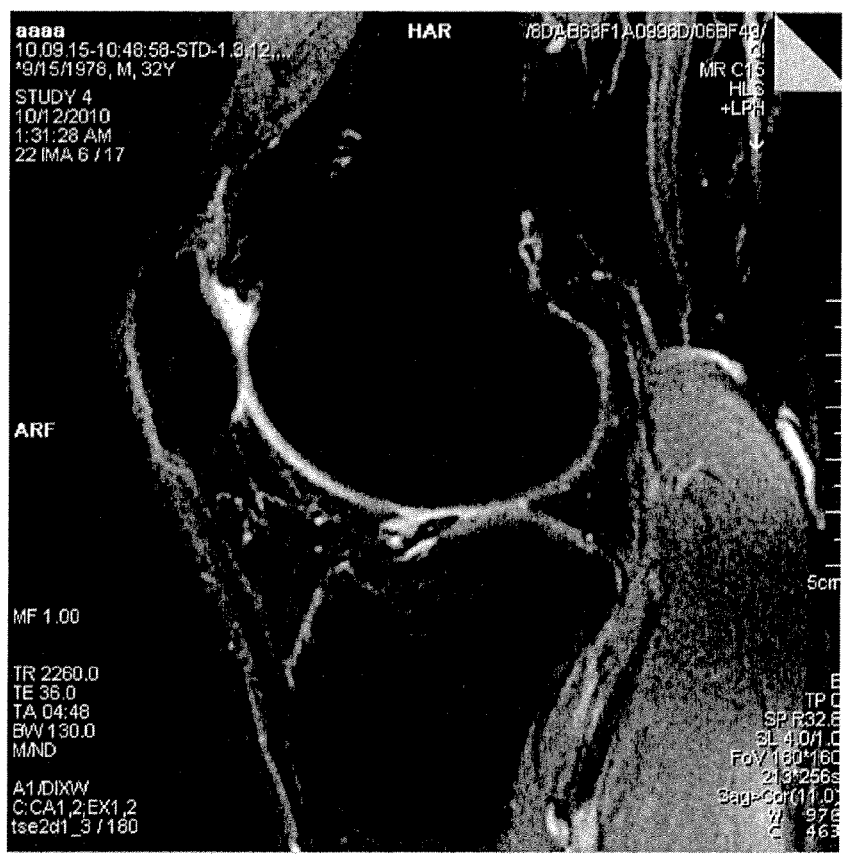
FIG. 8 shows a fat-suppressed, proton-weighted contrast image obtained using an embodiment of the present invention.

FIG. 7 shows various examples of images obtained by performing T2-weighted imaging with a low-field scanner, using the embodiments of the present invention and the prior art. 701 is an image obtained by a symmetric single-pole two-point Dixon method based on the prior art, 702 is an image obtained by a two-pole Dixon method based on the prior art, 703 and 705 are images obtained by the asymmetric single-pole two-point Dixon method provided in the embodiments of the present invention, 704 is an image obtained by a symmetric single-pole two-point Dixon method based on the prior art, and 706 is an image obtained by a short TI inversion recovery (STIR) sequence based on the prior art. Clearly, the artifact problem is least obvious in the images obtained by the asymmetric single-pole two-point Dixon method provided in the embodiments of the present invention; furthermore, the pictures are distinct and the contrast more authentic. In addition, fat suppression technology based on the STIR technique is the most commonly-used technology in low-field scanners and the gold standard thereof, but it can be seen from FIG. 7 that the embodiments of the present invention give better results than the prior art based on STIR; the embodiments of the present invention are fully capable of replacing the prior art based on STIR. Furthermore, the technology provided in the embodiments of the present invention overcomes the limitation of STIR technology in only being able to achieve T2 contrast. As FIG. 8 shows, the embodiments of the present invention allow fat-suppressed proton-weighted contrast images to be obtained, expanding the application range of low-field magnetic resonance systems.

In summary, the embodiments of the present invention can obtain better imaging results than the prior art, and can be realized without adding new hardware to a magnetic resonance system, so have a high level of practicability.

The present invention also provides a machine-readable storage medium, which stores commands for making a machine perform the method described herein. Specifically, a system or device equipped with a storage medium may be provided, with software program code which achieves the function of any one of the above embodiments being stored on the storage medium, and a computer (or CPU or MPU) of the system or device being set to read and execute the program code stored in the storage medium.

In this case, the program code read from the storage medium is itself capable of achieving the function of any one of the above embodiments, therefore the program code and the storage medium storing the program code form part of the present invention.

Embodiments of the storage medium used to provide program code include floppy disks, hard disks, magneto-optical disks, optical disks (such as CD-ROM, CD-R, CD-RW, DVD-ROM, DVD-RAM, DVD-RW, DVD+RW), magnetic tape, non-volatile memory cards and ROM. Optionally, program code may be downloaded from a server compute via a communication network.

In addition, it should be clear that the function of any one of the above embodiments can be achieved not only by executing the program code read by the computer, but also by having the operating system, etc., which operates on the computer, complete part or all of the actual operation based on the commands of the program code.

Moreover, it should be appreciated that the function of any one of the above embodiments can be achieved by writing the program code read from the storage medium into a memory installed in an expansion board in the computer or into a memory installed in an expansion unit connected to the computer, and then having a CPU, etc., that is installed on the expansion board or expansion unit, execute part or all of the actual operation based on the commands of the program code.

Disclosed herein is an imaging method for water/fat separation in MRI, which uses an FSE sequence based on the two-point Dixon method, wherein each refocusing RF pulse corresponds to two readout gradients of the same polarity and one rephasing gradient of opposite polarity; each of the two readout gradients corresponding to each refocusing RF pulse is divided into a front part and a rear part by the center of an echo, the rear part of a front readout gradient being smaller in area than the front part thereof, and the front part of a rear readout gradient being smaller in area than the rear part thereof. The method comprises: running an FSE sequence; subjecting each echo signal acquired to an FFT, so as to reconstruct an image with water and fat in phase and an image with water and fat in opposed phases, wherein data of each echo signal is subjected to a partial Fourier transform; and subjecting the image with water and fat in phase and the image with water and fat in opposed phases to a water/fat separation algorithm, to obtain a pure water image and a pure fat image. The present invention also provides a corresponding device capable of mitigating the problem of artifacts.

Although modifications and changes may be suggested by those skilled in the art, it is the intention of the inventor to embody within the patent warranted hereon all changes and modifications as reasonably and properly come within the scope of his contribution to the art.

I claim as my invention:

1. An imaging method for water/fat separation in magnetic resonance imaging, said method comprising:
    operating a magnetic resonance scanner to execute a fast spin echo sequence based on the two-point Dixon method, in which an RF excitation pulse is emitted followed by at least one refocusing RF pulse;
    operating said magnetic resonance scanner in said fast spin echo sequence to activate, after each RF refocusing pulse, two readout gradients of the same polarity and one rephasing gradient of opposite polarity between said two readout gradients, with each of said two readout gradient producing an echo signal having an echo center;
    operating said magnetic resonance scanner in said fast spin echo sequence to cause each of said two readout gradients to be divided into a front part and a rear part by the echo center of the echo signal produced thereby, with a rear part of a front readout gradient of said two readout gradients being smaller in area than a front part thereof, and with a front part of a rear readout gradient of said two readout gradients being smaller in area than a rear part thereof;
    in a processor, subjecting each echo signal acquired to a fast Fourier transform, so as to reconstruct an image with water and fat in phase and an image with water and fat in opposed phases, wherein data of each echo signal is further subjected to a partial Fourier transform; and
    in said processor, subjecting the image with water and fat in phase and the image with water and fat in opposed phases to a water/fat separation algorithm, to obtain a pure water image and a pure fat image at an output of said processor.

2. The method as claimed in claim 1, wherein of the two readout gradients corresponding to each refocusing RF pulse, the duration of the rear part of the front readout gradient is less than or equal to the duration of the front part thereof, and the duration of the front part of the rear readout gradient is less than or equal to the duration of the rear part thereof.

3. The method as claimed in claim 1, wherein:
    of the two readout gradients and the rephasing gradient corresponding to each refocusing RF pulse, when the front readout gradient switches to the rephasing gradient, the front readout gradient rises from a first amplitude to a zero gradient value at a maximum rate of gradient change, and when the rephasing gradient switches to the rear readout gradient, the rear readout gradient falls from the zero gradient value to the first amplitude at the maximum rate of gradient change; and the rephasing gradient rises from the zero gradient value to a second amplitude at the maximum rate of gradient change, and falls from the second amplitude to the zero gradient value at the maximum rate of gradient change; or the rephasing gradient rises from the zero gradient value to a second amplitude at a rate of gradient change that is less than the maximum rate of gradient change, and falls from the second amplitude to the zero gradient value at the rate of gradient change that is less than the maximum rate of gradient change; or the rephasing gradient rises from the zero gradient value to a second amplitude along a first curve, and falls from the second amplitude to the zero gradient value along a second curve, wherein the first curve and the second curve are axisymmetric curves with the center of the rephasing gradient as an axis.

4. The method as claimed in claim 1, wherein:

of the two readout gradients and the rephasing gradient corresponding to each refocusing RF pulse, when the front readout gradient switches to the rephasing gradient, the front readout gradient rises from a first amplitude to a zero gradient value at a first rate of gradient change that is less than a maximum rate of gradient change, and when the rephasing gradient switches to the rear readout gradient, the rear readout gradient falls from the zero gradient value to the first amplitude at the first rate of gradient change; and the rephasing gradient rises from the zero gradient value to a second amplitude at the maximum rate of gradient change, and falls from the second amplitude to the zero gradient value at the maximum rate of gradient change; or the rephasing gradient rises from the zero gradient value to a second amplitude at a second rate of gradient change that is less than the maximum rate of gradient change, and falls from the second amplitude to the zero gradient value at the second rate of gradient change; or the rephasing gradient rises from the zero gradient value to a second amplitude along a first curve, and falls from the second amplitude to the zero gradient value along a second curve, wherein the first curve and the second curve are axisymmetric curves with the center of the rephasing gradient as an axis.

5. The method as claimed in claim 4, wherein the second rate of gradient change is equal to the first rate of gradient change.

6. The method as claimed in claim 1, wherein:

of the two readout gradients and the rephasing gradient corresponding to each refocusing RF pulse, when the front readout gradient switches to the rephasing gradient, the front readout gradient rises from a first amplitude to a zero gradient value along a first curve, and when the rephasing gradient switches to the rear readout gradient, the rear readout gradient falls from the zero gradient value to the first amplitude along a second curve, wherein the first curve and the second curve are axisymmetric curves with the center of the rephasing gradient as an axis; and the rephasing gradient rises from the zero gradient value to a second amplitude at a maximum rate of gradient change, and falls from the second amplitude to the zero gradient value at the maximum rate of gradient change; or the rephasing gradient rises from the zero gradient value to a second amplitude at a rate of gradient change that is less than the maximum rate of gradient change, and falls from the second amplitude to the zero gradient value at the rate of gradient change that is less than the maximum rate of gradient change; or the rephasing gradient rises from the zero gradient value to a second amplitude along a third curve, and falls from the second amplitude to the zero gradient value along a fourth curve, wherein the third curve and the fourth curve are axisymmetric curves with the center of the rephasing gradient as an axis.

7. The method as claimed in claim 6, wherein the third curve and the first curve are a centrosymmetric curve with its center at the point of the zero gradient value to which the front readout gradient rises, and the fourth curve and the second curve are a centrosymmetric curve with its center at the point of the zero gradient value at which the rear readout gradient begins.

8. The method as claimed in claim 3, wherein the absolute values of the first amplitude and the second amplitude are the same.

9. The method as claimed in claim 1, wherein the sampling window for each echo signal includes a platform period of the readout gradient corresponding to the echo signal; or the sampling window for each echo signal includes a platform period of the readout gradient corresponding to the echo signal and part or all of an edge period of the readout gradient.

10. The method as claimed in claim 1, wherein the step of subjecting each echo signal acquired to an FFT so as to reconstruct an image with water and fat in phase and an image with water and fat in opposed phases comprises:

converting an analog signal of each echo signal acquired to a digital signal;

completing phase encoding and Fast Fourier Transform of the digital signal of each echo signal, so as to form complex image data for each echo signal and fill k-space with the same, wherein a readout line sampled from each echo signal is subjected to a partial Fourier transform before being subjected to a Fast Fourier Transform in the readout encoding direction of k-space; and the complex image data of each echo signal comprises image data with water and fat in phase and image data with water and fat in opposing phases.

11. A magnetic resonance imaging apparatus comprising:

a magnetic resonance scanner;

a control computer configured to operate the magnetic resonance scanner to execute a fast spin echo sequence based on the two-point Dixon method while an examination subject is situated in the magnetic resonance scanner;

said control computer being configured to operate said magnetic resonance scanner in said fast spin echo sequence to emit an RF excitation pulse followed by at least one refocusing RF pulse;

said control computer being configured to operate said magnetic resonance scanner in said fast spin echo sequence to activate, after each RF refocusing pulse, two readout gradients of the same polarity and one rephasing gradient of opposite polarity between said two readout gradients, with each of said two readout gradient producing an echo signal having an echo center;

said control computer being configured to operate said magnetic resonance scanner in said fast spin echo sequence to cause each of said two readout gradients to be divided into a front part and a rear part by the echo center of the echo signal produced thereby, with a rear part of a front readout gradient of said two readout gradients being smaller in area than a front part thereof, and with a front part of a rear readout gradient of said two readout gradients being smaller in area than a rear part thereof;

a processor configured to subject each echo signal acquired to a fast Fourier transform, so as to reconstruct an image with water and fat in phase and an image with water and fat in opposed phases, wherein data of each echo signal is further subjected to a partial Fourier transform; and said processor being configured to subject the image with water and fat in phase and the image with water and fat in opposed phases to a water/fat separation algorithm, to obtain a pure water image and a pure fat image at an output of said processor.

\* \* \* \* \*